US007010187B1

(12) United States Patent
Fitz

(10) Patent No.: US 7,010,187 B1
(45) Date of Patent: Mar. 7, 2006

(54) MODE TRANSITION-DISCRIMINATION PHOTONIC LOGIC DEVICE

(75) Inventor: John L. Fitz, Baltimore, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 11/151,172

(22) Filed: Jun. 9, 2005

(51) Int. Cl.
  *G02B 6/42* (2006.01)
(52) U.S. Cl. .............................. 385/18; 385/16; 385/24; 372/8
(58) Field of Classification Search .................... 372/8; 385/16–24
  See application file for complete search history.

(56) References Cited

U.S. PATENT DOCUMENTS

| 4,252,403 | A | | 2/1981 | Salisbury |
| 5,363,463 | A | | 11/1994 | Kleinerman |
| 5,572,540 | A | * | 11/1996 | Cheng ..................... 372/50.12 |
| 5,764,681 | A | | 6/1998 | Ballantyne et al. |
| 6,324,326 | B1 | * | 11/2001 | Dejneka et al. ............. 385/123 |
| 6,907,154 | B1 | * | 6/2005 | Oikawa et al. ............... 385/17 |
| 2005/0158898 | A1 | * | 7/2005 | Scherer ....................... 438/29 |

OTHER PUBLICATIONS

David S. Levy et al "A New Design for Ultra Compact Multimode Interference-Based 2x2 Couplers", *IEEE Photonics Technology Letters*, vol. 10, No. 1, Jan. 1998 pp. 96-98, Publisher Item Identifier S 1041-1135(98) 00456-X, USA.
Horacio Lamela, et al, "Analysis of the Dynamic Behavior and Short-Pulse Modulation Scheme for Laterally Coupled Diode Lasers", *IEEE Journal on Selected Topics in Quontum Electronics*, vol. 7, No. 2, Mar./Apr. 2001, pp. 192-200, Publisher Identifier S 1077-260X(01) 08118-7, USA.
Mitsuru Takenaka et al. "Multimode Interference Bistable Laser Diode" *IEEE Photonics Technology Letters*, vol. 15, No 8, Aug. 2003, pp. 1035-1037, USA Digital Object Identifier 10. 1109/LPT, 2003.815361.
Dominic F. G. Gallagher, "Gain-Coupled Optical Logic in Semiconductor Lasers", *Applied Optics* vol. 29, No. 29, Oct. 10, 1990, pp. 4359-4371, 0003-6935/90/294359-13, 1990 Optical Society of America, USA.
Mitsuru Takenaka et al, "All Optical Flip-Flop Multimode Interference Bistable Laser Diode", *IEEE Photonics Technology Letters*, vol. 17, No 5, May 2005 pp. 968-970, Digital Object Identifier 10.1109/LPT, 2005, 844322, USA.

* cited by examiner

*Primary Examiner*—Michelle Connelly-Cushwa
*Assistant Examiner*—Rhonda S. Peace
(74) *Attorney, Agent, or Firm*—Jennifer P. Ferragut

(57) ABSTRACT

The present invention is a photonic logic circuit for multimode optical signals. The device includes a laser cavity having at least four conduits, the combination forming a substantially X-shaped construction. An output is attached to each conduit for transmission of the optical signals from the cavity. At least one input is connected to the laser cavity. The input is connected to an upper or lower edge of the laser cavity. These are the edges that do not include conduits. A bias contact is connected to the cavity and the two lower conduits. The bias contact is used to pump the photonic device. Preset contacts are attached to each of the upper two conduits and their respective outputs. The preset contacts are used to control the logic function of the photonic logic device. Altering current pump settings between the respective contacts controls the direction of lasing between outputs of the photonic device and the logic function performed.

44 Claims, 2 Drawing Sheets

MODE TRANSITION-DISCRIMINATION PHOTONIC LOGIC DEVICE

FIELD OF THE INVENTION

The present invention relates to coherent light generators and, more specifically, to mode discriminating coherent light generators.

BACKGROUND OF THE INVENTION

Multi-mode laser diodes (MMLDs) are frequently used in electro-optical devices. An MMLD is a laser diode that supports at least two stable modes, though these modes are not necessarily supported at the same time. Typical operation of the laser diode may operate by injection of a current into the device, which causes the coupled lasers to alternate between modes. In many embodiments it is desirable to use MMLDs as optical oscillators, in which case the MMLD include electrical signal inputs along the longitudinal axis of the device. These electrical signals cause perturbations in the mode structure of the MMLD, activating additional modes of the MMLD. The outputs of the MMLD are similarly located along the longitudinal axis of the device.

Though these devices are effective in many situations, some problems do exist. One of the most significant limitations is the cross-talk between the input signals and the output signals. As is apparent to those of skill in the art, cross-talk is the phenomenon where signals from one channel cross over into another channel and vice versa in a multi-channel environment. This severely limits the accuracy of the fabricated device and prevents the use of such devices for a number of purposes. Current devices also encounter problems with discrimination between output modes. In most logic devices the output waveguides are closely spaced. This makes discrimination of the modes difficult, resulting in the operation of unwanted modes. MMLDs present the result of the logical operation as the presence or absence of a signal in a specific mode. If the modes can not be accurately discriminated, the logical results can not be cascaded to further logic gates. Finally, MMLDs are generally large in terms of other opto-electronic devices. The length is necessary to allow mode interaction given the typical construction, which includes parallel waveguides and on-axis input signals.

U.S. Pat. No. 4,252,403, entitled "COUPLER FOR GRADED INDEX FIBER," discloses a basic construction for propagation of multiple modes between two fibers. Specifically, this patent discloses a concentric core fiber that is coupled to a graded index fiber by precisely aligning the concentric core fiber with the graded index fiber. Low order modes propagating in the concentric core fiber are coupled to the central region of the graded index fiber and high order modes of the concentric core fiber are coupled to the inner core of the graded index fiber. The present patent does not use this method for propagation of signals. U.S. Pat. No. 4,252,403 is hereby incorporated by reference into the specification of the present invention.

U.S. Pat. No. 5,363,463, entitled "REMOTE SENSING OF FIBER OPTIC VARIABLES WITH FIBER OPTIC SYSTEMS," discloses a variety of fiber optic systems. One such system includes structures for diverting temperature and force information from the optical fiber of the system for measurement, and for reintroducing information into the system at any one of a number of points along the side of the optical fiber. The optical fiber is appropriately prepared along its side to have information reintroduced at certain points. The present invention does not operate according to these principles. U.S. Pat. No. 5,363,463 is hereby incorporated by reference into the specification of the present invention.

U.S. Pat. No. 5,764,681, entitled "DIRECTIONAL CONTROL METHOD AND APPARATUS FOR RING LASER," discloses a method for controlling direction of coupled lasers. Specifically, an asymmetric feedback structure is used to actively or passively control lasing of the system. Active control, which permits directional control of the laser, is achieved through the use of a dielectric stack. Passive control operates through introduction of asymmetry into the path of the laser, preferably by use of a diode to produce cross-coupling of two modes of a laser. The present invention does not operate according to these principles. U.S. Pat. No. 5,764,681 is hereby incorporated by reference into the specification of the present invention.

"A New Design for Ultracompact Multimode Interference-Based 2X2 Couplers," David S. Levy, et al., *IEEE Photonics Technology Letters*, discloses a splitter device that takes a single input and splits the signal into two outputs. The single input is introduced along the axis of the splitter. The structure includes two tapered structures, the tapered ends of the structures being joined in the centers. Both parabolically and linearly tapered devices are proposed. The device includes both two inputs and two outputs, the signal being propagated along the axis of one of the inputs. The present invention does not operate in this manner. This disclosure is hereby incorporated by reference into the specification of the present invention.

"Analysis of the Dynamic Behavior and Short-Pulse Modulation Scheme for Laterally Coupled Diode Lasers," Horatio Lamela, et al., *IEEE Journal on Selected Topics in Quantum Electronics*, discloses a structure having two parallel lasers that allows mode coupling between the lasers. Specifically, the two parallel lasers, given sufficient length, are spaced closely enough to allow switching of power from one laser to the other. To achieve this, the lasers must both be longer than is desirable for most mode switching applications and must be very closely spaced, which makes the modes difficult to isolate. This structure is not the same as that of the present invention. This disclosure is hereby incorporated by reference into the specification of the present invention.

"Multimode Interference Bistable Laser Diode," Mitsui Takenaka, et al., *IEEE Photonics Technology Letters*, discloses a bistable laser structure that switches output modes when an appropriate optical input signal is injected. Specifically, a signal is input along the axis of one of two waveguide inputs. The two waveguides are closely spaced to allow coupling into modes within the bistable laser. The bistable laser must be of sufficient length to allow mode interaction with the injected input signals. As was explained previously, this length is generally greater than is desirable for most multimode applications. Additionally, the close spacing of the output waveguides makes mode discrimination difficult and the on-axis input signal injection is prone to unintended signal scattering back into the input waveguides. The present invention does not operate in this manner. This disclosure is hereby incorporated by reference into the specification of the present invention.

Prior art multimode laser diode photonic logic devices have significant limitations in the electro-optical arts. Specifically, to allow interaction between the modes and input signals, most devices must be long. Because a primary goal of electro-optical device designers is to obtain the most compact device possible, this is a significant limitation.

Further, most prior art devices operate by closely spacing the output waveguide structures, which results in an inability to accurately discriminate between modes of the output signal. It is therefore desirable in the art to have a compact multimode laser diode photonic logic device that allows accurate discrimination between the modes of the output signal. It is further desirable in the art to have a multimode laser diode photonic logic device that can accept an input signal off-axis with respect to the output signal to prevent unintended signal scattering back into the input waveguides.

SUMMARY OF THE INVENTION

It is an object of the invention to provide a multi-mode photonic logic device for optical input signals.

It is a further object of the present invention to provide a multi-mode photonic logic device for optical input signals that allows accurate discrimination between modes of an output signal.

It is another object of the present invention to provide a compact multi-mode photonic logic device for optical input signals that allows accurate discrimination between modes of an output signal that is effective for input signals of various wavelengths.

The present invention is a photonic logic circuit for multimode optical output signals. The device includes a laser cavity having at least four conduits, the combination forming a substantially X-shaped construction. The upper and lower edges of the laser cavity are preferably curved. An output, preferably a waveguide, is attached to each conduit for transmission of the optical signals from the cavity.

At least one input is connected to the laser cavity. The input is connected to an upper or lower edge of the laser cavity. These are the edges that do not include conduits. This configuration is called off-axis input. A bias contact is connected to the cavity and the two lower conduits. The bias contact is used to pump the photonic device. Preset contacts are attached to each of the upper two conduits. The preset contacts are used to control the logic function of the photonic logic device. Altering the application of current between the respective contacts controls the direction of lasing between outputs of the photonic device. This embodiment performs invert and exclusive OR logic functions.

In an alternative embodiment, a laser cavity includes only three outputs. In this embodiment a single bias contact may be used to contact all three conduits of the cavity. The alternative embodiment performs invert and exclusive OR logic functions.

DETAILED DESCRIPTION OF THE PREFERRED EMBODIMENT

Figure 1:
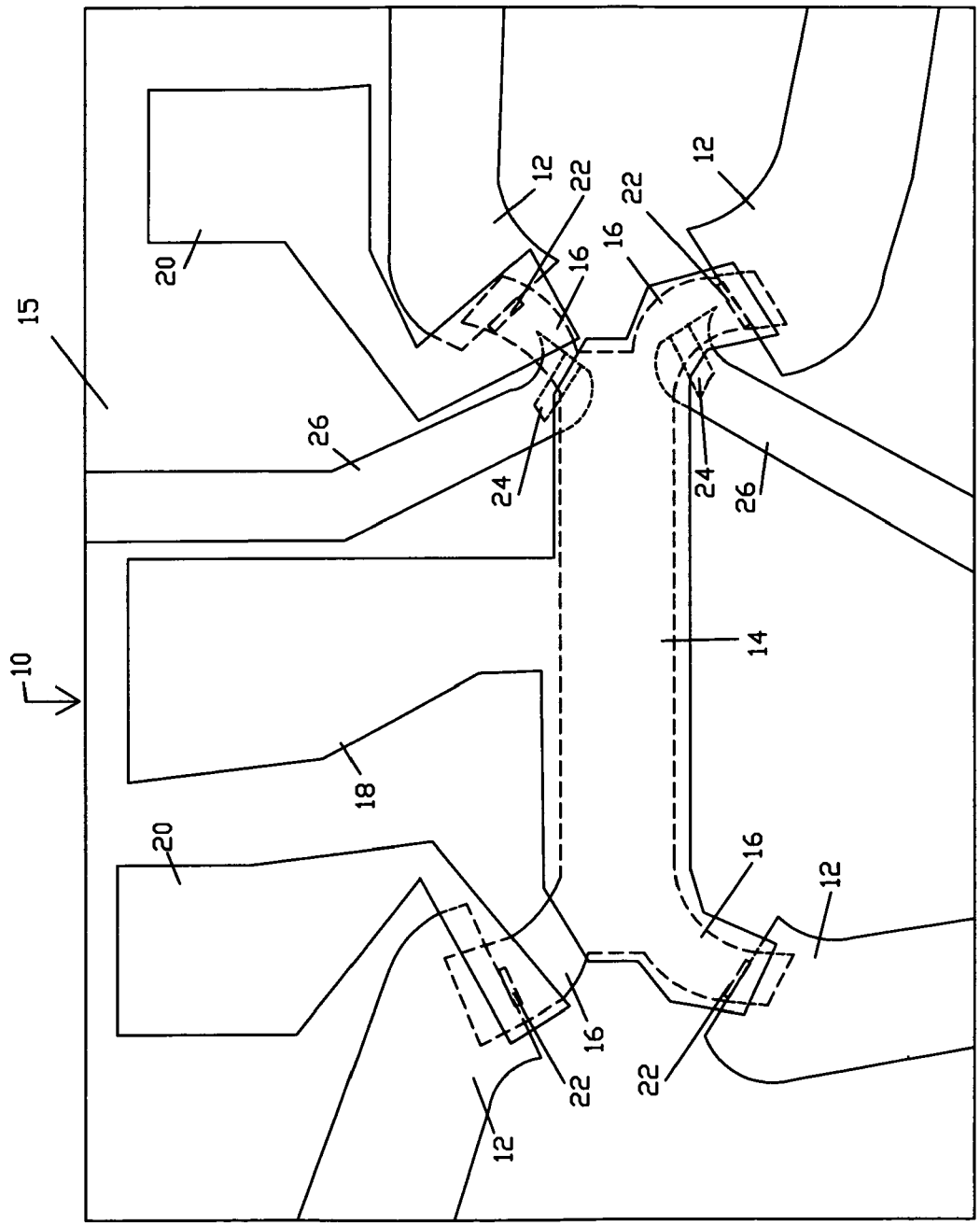
FIG. 1 is a top view of the photonic device of the present invention.

The present invention is a multimode photonic logic device. Referring to FIG. 1, the photonic device 10 of the present invention is shown in greater detail. The photonic device 10 includes four outputs 12. Each output is a device capable of transmitting an optical signal. Such devices include, but are not limited to, waveguides and optical fibers. As is obvious to those skilled in the art, such devices are common electro-optical devices for transmitting information in the form of light between two electro-optical devices. A waveguide is commonly etched into a semiconductor device to transmit light between other devices located thereon, or between semiconductors. Optical fibers are frequently used to transmit information between electro-optical devices. Any typical electro-optical device capable of transmitting an optical signal may be used as the outputs for the present invention, many of which are well known and commonly used in the art. In the preferred embodiment the outputs 12 are planar waverguides.

The photonic device 10 further includes cavity 14 connected to outputs 12. As is obvious to those skilled in the art, cavity 14 is a chamber in the center of photonic device. Cavity 14 has wide outer edges that taper towards the center of the cavity 14. In the preferred embodiment the width at the center is approximately 6 um. The outer edges of the cavity 14 are preferably parabolic, however the outer edge may follow a circular curve or have any other suitable shape cavity as would be obvious to those of skill in the art. For example, the cavity 14 may have substantially V-shaped outer edges. In the preferred embodiment the length of the cavity 14 is 45.9 um and the circular curve of the outer edge of the cavity preferably arcs at approximately a 50.2 degree angle given an arc radius of 53.1 um. Cavity 14 is composed of an appropriate semiconductor substrate material. In the exemplified embodiment, the material is a III–V semiconductor material, preferably GaAs.

Cavity 14 includes four conduits 16. Each conduit 16 is preferably a protrusion extending from an edge of the cavity 14. One conduit 16 extends from the top left side and one from the top right side of the cavity 14. Similarly, one conduit 16 extends from the bottom left side and one from the bottom right side of the conduit. The conduits 16 preferably protrude from the cavity 14 such that the conduits form a smooth surface with the outer edge of the cavity 14. Further, each conduit 16 preferably has the same cross-section and epitaxial structure as the cavity 14. Each conduit 16 is preferably approximately 3 um wide. The cavity 14, including conduits 16, is preferably substantially X-shaped.

Substrate 15 is connected to the backside of cavity 14. As is obvious to those of skill in the art, substrate 15 is a conventional semiconductor substrate. In the preferred embodiment, cavity 14 is epitaxially grown on substrate 15, however cavity 14 may be connected to substrate 15 in any conventional manner many of which are well known and commonly used in the art. In the preferred embodiment substrate 15 is composed of the same material as cavity 14. In the exemplified embodiment, substrate 15 is composed of GaAs, however other suitable material may also be used such as InP.

Bias contact 18 is connected to cavity 14 such that it is in contact with the entire cavity except the two conduits 16 located along the upper edge of the cavity 14. The connection between bias contact 18 and conduits 16 will be explained in greater detail below. Bias contact 18 is a layer of metal disposed on the photonic device. The metal is composed of an Ohmic material compatible with the material of the laser, and therefore will vary depending on the laser material as would be obvious to those of skill in the art. Typical Ohmic materials used for bias contact 18 include titanium platinum gold, chromium gold p-type contacts for GaAs materials, and gold tin gold n-type contacts for GaAs materials.

Preset contacts 20 are connected to conduits 16 such that each preset contact 20 is connected to a conduit 16 not connected to the bias contact 18. Each preset contact is further connected to the cavity 14 such that the preset contact 20 is not in contact with the bias contact 18. In the preferred embodiment, each preset contact 20 is connected to its respective conduit 16 such that a gap exists between the joined portion of the conduit 16 and the preset contacts 20 and the juncture of the conduit 16 to the remainder of the cavity 14. In the preferred embodiment, the gap between these two regions is approximately 2 um. As with the bias contact 18, preset contacts 20 are a layer of metal disposed on the photonic device. The metal is composed of an Ohmic material compatible with the material of the laser, and therefore will vary depending on the laser material as would be obvious to those of skill in the art. Typical Ohmic materials used for bias contact 18 include titanium platinum gold, chromium gold, and gold tin gold.

Mirrors 22 are disposed between cavity 14 and outputs 12. In the preferred embodiment, four mirrors 22 are disposed between conduits 16 and outputs 12 such that one mirror 22 is disposed between each conduit 16 and its corresponding output 12. In the preferred embodiment the mirrors 22 are planar, however as is obvious to those skilled in the art the mirrors 22 may be of any other suitable shape, such as curved or confocal. Additionally, three mirrors 22 may be used in place of the four mirrors 22. If three mirrors 22 are used, one mirror 22 is disposed on each of the left and right side of the photonic device 10 between the conduits 16 and the outputs 12 and a third mirror is disposed on one of the left or right side between a conduit 16 and an output 12 that does not already include a mirror. Mirrors are preferably structures etched in the conduit 16 described above. To achieve this, the preset contacts 20 and bias contact 18 must sufficiently overlap the conduits 16 to allow a mirror to be etched along the junction of the conduits 16 and outputs 12. Manners of etching mirrors are well known and commonly used in the art and any conventional method could be used in conjunction with the present invention. For example, the edge of a preset contact 20 may be deposited over a conduit 16 in a shape to allow current injection of a specific region of the laser structure. The shapes of the preset contacts 20 and bias contact 18 (which are metal structures) cover the area of the laser that will require current injection. This area is the entire area of the laser cavity 14 and conduits 16, including the area that will form the mirrors 22. The only areas that will not be covered by the preset contacts 20 and bias contact 18 are the gaps between the contacts. A photoresist will be patterned such that it protects all surfaces of the semiconductor where etching is not required. A photoresist is not present where etching will occur and mirrors 22 will be formed. The etching will occur at the edges of each of the conduits 16 that are furthest from the cavity 14. During etching, all other portions of the device are protected by the photoresist. The photoresist opening is overlapped with the edges of the bias contact 18 and the preset contacts 20 where the mirrors will be formed such that the contacts are exposed to the etch along their respective edges. In the exemplified embodiment, the conduits 16 are etched anisotropically to form vertical sidewalls, but may be etched by any other suitable means as would be obvious to those of skill in the art. As was discussed above, any material not covered by photoresist is etched during this process. However, since the edges of the bias contact 18 and preset contacts 20 are not covered by a photoresist at the edges where the mirrors 22 are etched, it is the contacts that protect the semiconductor and allow mirrors 22 to be formed only along the edges of the preset contacts 20 and bias contact 18. In this manner the contacts actually act as an etch mask to protect the semiconductor region covered by the each contact. The mirrors 22 are formed between the edges of each contact and any area protected by photoresist. A reflective coating may also be applied to the mirrors 22 at this time. Outputs 12, such as waveguides, may be deposited at this point through any conventional method, as would be obvious to those of skill in the art.

Ports 24 are connected to cavity 14. In the preferred embodiment, at least one port 24 is connected to cavity 14 along a top or bottom edge of cavity 14. As was discussed previously, cavity 14 preferably includes top and bottom parabolic edges. In the exemplified embodiment, two ports 24 are disposed along the bottom parabolic edge of the cavity 14. This connection of the port 24 to the cavity is referred to as off-axis input. This is because the input is not along the central axis of the laser cavity. In a more preferred embodiment multiple ports 24 are disposed along each of the top and bottom edges of the cavity 14, at least one of the ports 24 being disposed along a conduit 16. In alternative embodiments, ports 24 may be located in any variety of combinations, such as having one port 24 on each of the top and bottom parabolic edges of the cavity, or distributing three ports 24 along the edges of the cavity 14. A port 24 is preferably an optical port etched into the device that allows optical signals to be transmitted from an external optical device into cavity 14, but may be any device that allows transmission of optical signals between optical devices. Many such devices are well known and commonly used in the art, and any such conventional device may be used in conjunction with this invention. To reduce reflectance in the ports 24, an anti reflective coating may be applied to each port 24. The remaining anti reflective coating prevents excess light from being reflected away from the port 24. Ports 24 may be omitted if reflectance modification on the input surfaces of the cavity is not required, as described in more detail below.

The photonic device 10 further includes inputs 26 connected to ports 24 to conduct optical signals to cavity 14. As with outputs 12, an input is any electro-optical device capable of transmitting an optical signal to photonic device 10. Such devices were discussed in greater detail with reference to outputs 12 above. In the preferred embodiment, inputs 26 are waveguides. As was also discussed in greater detail above, waveguides are conventionally grown, deposited, and/or etched on a semiconductor device, however any conventional waveguide may be used for the inputs 26 of the present invention. If the interface between inputs 26 and cavity 14 were coated by mirror 22 high reflectance coatings, ports 24 may be used to remove the high reflectance coatings deposited on the interfaces between inputs 26 and cavity 14 via an etch process, in an effort to maximize the optical signals present at cavity 14.

To operate the photonic device 10 of the present invention, bias is increased in the bias contact 18 such that two longitudinal (left to right) conduits 16 (as opposed to two lateral (top to bottom) conduits 16 lase. Briefly, the bias is increased in the bias contact 18 causing the electrons within the cavity 14 to be excited to upper energy states, emitting photons, which reflect between the mirrors 22. When the laser cavity is curved, increased reflectivity may be required at mirrors 22 to mitigate losses. Sufficient excitation of these electrons will result in lasing between two conduits 16. The photonic device 10 will operate in either cross-mode (meaning one upper conduit 16 and one lower conduit 16 will lase) or bar-mode (meaning both top conduits 16 or both bottom conduits 16 will lase) based on the electrical arrangement of the photonic device 10, such as the shape of the bias contact 18 and diameter of the edge of cavity 14. The bias on preset contacts 20 and bias contact 18 of the photonic device 10 dictates which two conduits 16 lase. The specific mechanism by which the optical signal lases between the two conduits is well known to those of skill in the art, and will not be explained in greater detail here. For the purposes of this description it will be assumed that lasing initially occurs between the bottom right conduit 16 and the bottom left conduit 16.

At least one optical signal is transmitted through an input 26 to a port 24. For the purposes of this description, operation will be discussed with respect to two optical input signals—one each on the top and bottom right sides of the photonic device 10. In a preferred embodiment, each signal is transmitted through an input 26 to a port 24 that is connected to a conduit 16 (by way of a port 24.) As was explained in greater detail above, each optical input signal is a light signal containing information to be transmitted through an optical device. By transmitting the optical signal through the port 24, the optical signal is introduced into a conduit 16.

To cause lasing between the lower two conduits 16, current is applied to the bias contact 18 under forward bias until the bottom two conduits lase. Current is then introduced to either of the upper two preset contact 20. For the purpose of this description we will assume current is increased in the upper right preset contact 20. The current is increased until lasing occurs between the upper right conduit 16 and the lower left conduit 16. In this state the lower right conduit will normally not lase, or is "off", and the upper right conduit normally will lase, or is "on," commonly referred to as a cross-mode. Cavity 14 has only sufficient gain to support lasing between two longitudinal conduits. As such, when the upper right conduit switches on, there is not sufficient gain within cavity 14 to support lasing on the lower right conduit 16 and it switches off. An optical input signal can be introduced through either of ports 24. If an optical signal is introduced into the lower right conduit 16, the lower right conduit 16 will begin to lase with the lower left conduit 16. This is because the electrons in the lower right conduit 16 are stimulated by the external optical signal sufficiently to allow lasing between the lower right and lower left conduits 16. Because the gain in the cavity 14 region is only sufficient to support lasing between two longitudinal conduits 16, lasing ceases between the upper right conduit 16 and lower left conduit 16. When an optical signal was introduced into the upper right conduit 16, the upper right conduit 16 ceases to lase due to off-axis stimulated emission within the conduit 16 and the lower right conduit 16 starts to lase with the lower left conduit 16.

Alternatively, to cause lasing between the lower two conduits 16 in what is commonly referred to as a bar-mode, after conditions are initially established for a cross-mode as detailed above current is increased to the bias contact 18 under forward bias until the bottom two conduits just begin to lase. The upper right conduit ceases to lase because there is only sufficient optical gain in the cavity 14 to allow lasing between two longitudinal conduits 16 at any given time. In this state the lower right conduit will normally lase, or is "on", and the upper right conduit normally will not lase, or is "off." An optical input signal can be introduced through either of ports 24. If an optical signal is introduced into the upper right conduit 16, the upper right conduit 16 will begin to lase with the lower left conduit 16. This is because the electrons in the upper right conduit 16 are stimulated sufficiently to allow lasing between the upper right and lower left conduits 16. Because the gain in the cavity 14 region is only sufficient to support lasing between two longitudinal conduits 16, lasing ceases between the lower right conduit 16 and lower left conduit 16. When an optical signal was introduced into the lower right conduit 16, the lower right conduit 16 ceases to lase due to off-axis stimulated emission and the lower left conduit 16 lases with the upper right conduit 16.

Figure 2:
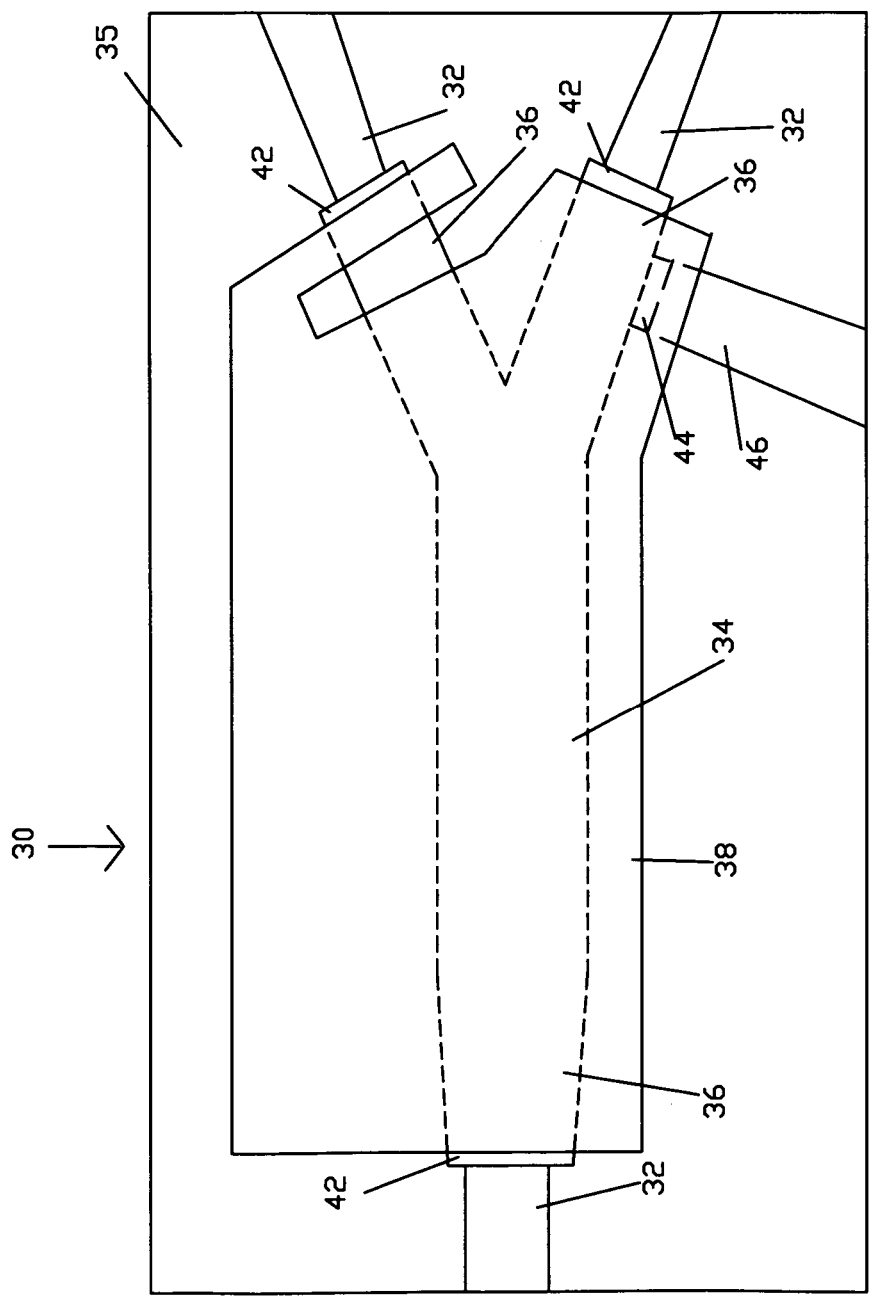
FIG. 2 is a top view of an alternative embodiment of the photonic device of the present invention

FIG. 2 shows an alternative embodiment of the alternative photonic device 30 of the present invention. The alternative photonic device 30 preferably includes three outputs 32. The outputs 32 of the alternative photonic device 30 are essentially identical to the outputs 12 of the photonic device 10 of FIG. 1. Because the outputs 12 of the photonic device 10 of FIG. 1 were described in detail above, the outputs 32 of the alternative embodiment of alternative photonic device 30 will not be described in greater detail.

A cavity 34 is connected to the outputs 32 of the alternative photonic device 30. Each output 32 is connected to a conduit 36 of the cavity 34. The cavity 34 is an essentially Y-shaped chamber in the center of the alternative photonic device 30. In the preferred embodiment, the top and bottom edges of the cavity 34 are parabolic, however the edges may be any other suitable configuration allowing two outputs on one side and one output on the opposing side according to user preferences.

The alternative photonic device 30 further includes three conduits 36 connected to cavity 34. Conduits 36 are essentially identical to the conduits 16 of the photonic device of 10 shown in FIG. 1, however in the alternative embodiment shown in FIG. 2, as was discussed above, the cavity 34 includes only one conduit 36 on one side and two conduits 16 on the opposing side. Although in the embodiment shown the single conduit 36 is shown on the left side of the alternative photonic device 30, it may be on either the left or right side of the alternative photonic device 30 and the remaining two conduits 36 may be located on the opposite side according to user preferences.

Substrate 35 is connected to the backside of cavity 34. As is obvious to those of skill in the art, substrate 35 is a conventional semiconductor substrate. In the preferred embodiment, cavity 34 is epitaxially grown on substrate 35, however cavity 34 may be connected to substrate 35 in any conventional manner many of which are well known and commonly used in the art. In the preferred embodiment substrate 35 is composed of the same material as cavity 34. In the exemplified embodiment, substrate 35 is composed of GaAs, however other suitable material may also be used such as InP.

Alternative photonic device 30 includes bias contact 38 connected to cavity 34. Bias contact is 38 connected to cavity 34 such that it is in contact with the entire cavity 34, with the exception of a small area left uncovered on one of the conduits 36 located on the edge of the cavity having two conduits 36 due to a notch in bias contact 38. The uncovered area is the minimum width required to prevent spontaneous lasing in the conduit 36 when biased to allow lasing in the opposite conduit, and accordingly will vary based on the specific dimensions of the alternative photonic device 30. The connection between bias contact 38 and conduits 36 will be explained in greater detail below. Bias contact 38 is a layer of metal disposed on the photonic device. The metal is composed of an Ohmic material compatible with the material of the laser, and therefore will vary depending on the laser material as would be obvious to those of skill in the art. Typical Ohmic materials used for bias contact 38 include titanium platinum gold, chromium gold, and gold tin gold.

The alternative photonic device 30 includes mirrors 42 that are essentially identical to mirrors 22 of the photonic device of FIG. 1 disposed between conduits 36 and outputs 32. Mirrors 42 are created in the same manner as mirrors 22, except that all three mirrors 42 of the alternative photonic device 30 of FIG. 2 are created using the same bias contact 38. For a more detailed discussion of mirrors 42, please reference the discussion of mirrors 22 of photonic device 10 of FIG. 1 above.

A port 44 is connected to a conduit 36 on the side of the alternative photonic device 30 including two conduits 36. As was explained in greater detail above, a port is an optical device capable of transmitting optical signals to the cavity 34. In a preferred embodiment the port is connected to the conduit 36 at a portion of the conduit 36 that is in contact with the bias contact 38. However, the port may also be disposed on a portion of the conduit 36 that is not in contact with the bias contact 38 (this portion being located along the notch in the bias contact 38) in an alternative embodiment. The implications of this alternative embodiment will be explained in greater detail below. The port 44 is essentially identical to port 24 of the photonic device of FIG. 1, and therefore will not be described in greater detail.

Alternative photonic device 30 of FIG. 2 includes an input 46 connected to port 44. Input 46 transmits an optical signal to port 44. Input 46 can be any input capable of transmitting an optical signal to port 44, but is preferably a waveguide. Input 46 is essentially identical to input 26 of photonic device 10 of FIG. 1, and therefore will not be described in greater detail.

To operate the alternative photonic device 30 of the alternative embodiment of FIG. 2, bias is applied to the bias contact 38 such that a current is created in the bias contact 38. Bias is increased in the bias contact 38 such that the conduit 36 that does not include the notched region of bias contact 38 lases with the conduit on the opposite side of the alternative photonic device 30, the alternative photonic device 30 lasing from left to right. Lasing occurs in the same manner in the alternative photonic device 30 as in the photonic device 10 of FIG. 1, and will not be explained in greater detail here. The notch in the bias contact 38 prevents sufficient current density from being injected to the conduit 36 in contact with the notched portion of the bias contact 38 to allow that conduit 36 to lase. The specific mechanism by which the optical signal lases between the two conduits is well known to those of skill in the art, and will not be explained in greater detail here.

An optical signal is transmitted through input 46 to port 44. As was explained in greater detail above, the optical signal is a light signal containing information to be transmitted through an optical device. As was further explained in greater detail above, the port is preferably located on the conduit that is entirely in contact with the bias contact 38. By transmitting the optical signal through the port 44, the optical signal is introduced into the conduit 36.

The optical signal introduced through port 44 causes lasing to switch from its original configuration to lase between the conduit 36 contacting the notched portion of the bias contact 38 and the opposing conduit 36. The addition of the optical signal provides sufficient additional off-axis optical power to quench the laser gain, preventing lasing of the conduit 36 attached to the port 44, allowing lasing at the conduit 36 contacting the notched portion of the bias contact 38, however does not provide sufficient gain to the alternative photonic device 30 to allow lasing in both conduits 36. This occurs because, when an optical signal was introduced into the conduit 36, the conduit 36 ceases to lase due to off-axis stimulated emission. Removal of the optical signal returns the alternative photonic device 30 to its initial lasing state. By this mechanism, a logic operation is performed by the alternative photonic logic device. In the alternative embodiment, port 44 is connected to conduit 36 at a portion not contacting bias contact 38. Introduction of an optical signal into port 44 causes lasing to occur between the conduit 36 attached to the port 44 and the opposing conduit 44. This occurs because the electrons in the conduit 36 are stimulated sufficiently to allow lasing between the conduit 36 attached to the port and the opposing conduit 36. Because the gain in the cavity 34 region is only sufficient to support lasing between two longitudinal conduits 36, lasing ceases between the conduit 36 that does not include the notched region of bias contact 38 and left conduit 36.

What is claimed is:

1. A photonic logic device comprising:
   a) a laser cavity having at least three conduits, wherein each conduit protrudes from an edge of said laser cavity;
   b) at least three outputs, each output being connected to a conduit of said laser cavity;
   c) at least one port, said at least one port being connected to an edge of said laser cavity from which said at least three conduits do not protrude;
   d) at least one input, said at least one input being connected to said at least one port;
   e) at least three mirrors, each of said mirrors being disposed between one of said at least three outputs and one of said at least three conduits;
   f) a bias contact connected to said cavity and said at least three outputs, wherein said bias contact includes a notch, and wherein said bias contact is in contact with substantially all of said cavity except that said bias contact does not contact one of said at least three conduits at the location of said notch;
   g) a substrate connected to said cavity.

2. The photonic logic device of claim 1, further including a port connected to said input and said cavity, wherein said port is disposed between said input and said cavity.

3. The photonic logic device of claim 2, wherein said at least one port is connected to said cavity at a conduit of said cavity.

4. The photonic logic device of claim 3, wherein said bias contact is composed of a material chosen from the group of materials consisting of titanium platinum gold, chromium gold, gold tin gold, germanium gold, nickel gold and any other suitable material.

5. The photonic logic device of claim 4, wherein said each of said at least three mirrors is a mirror etched from said bias contact (using contact as an etch mask).

6. The photonic logic device of claim 5, wherein said laser cavity is substantially Y-shaped.

7. The photonic logic device of claim 6, wherein said cavity has an upper edge and a lower edge and said upper edge and said lower edge of said laser cavity are substantially parabolic.

8. The photonic logic device of claim 7, wherein each of the at least three outputs is chosen from the group of outputs consisting of a waveguide, an optical fiber, and any other suitable output.

9. The photonic logic device of claim 8, wherein the at least one inputs is chosen from the group of inputs consisting of a waveguide, an optical fiber and any other suitable input.

10. The photonic logic device of claim 9, wherein said at least one port is located at a section of the laser cavity that is in contact with the bias contact.

11. The photonic logic device of claim 10, wherein said at least one port is located at a section of the laser cavity that is not in contact with the bias contact.

12. The photonic logic device of claim 1, wherein said at least one port is connected to said cavity at a conduit of said cavity.

13. The photonic logic device of claim 3, wherein said bias contact is composed of a material chosen from the group of materials consisting of titanium platinum gold, chromium gold, gold tin gold, germanium gold, nickel gold and any other suitable material.

14. The photonic logic device of claim 1, wherein each of said at least three mirrors is a mirror etched from said bias contact.

15. The photonic logic device of claim 1, wherein said laser cavity is substantially Y-shaped.

16. The photonic logic device of claim 1, wherein said laser cavity includes an upper edge and a lower edge, and wherein the upper edge and the lower edge are substantially parabolic.

17. The photonic logic device of claim 1, wherein each of the at least three outputs is chosen from the group of outputs consisting of a waveguide, an optical fiber, and any other suitable output.

18. The photonic logic device of claim 1, wherein the at least one inputs is chosen from the group of inputs consisting of a waveguide, an optical fiber and any other suitable input.

19. The photonic logic device of claim 1, wherein said at least one port is located at a section of the laser cavity that is in contact with the bias contact.

20. The photonic logic device of claim 1, wherein said at least one port is located at a section of the laser cavity that is not in contact with the bias contact.

21. A photonic logic device comprising:
   a) a laser cavity having at least four conduits, said laser cavity having a top edge a bottom edge, a left edge and a right edge, and wherein two conduits protrude from each of the left edge and a the right edge of said laser cavity;
   b) at least four outputs, each output being connected to a conduit of said laser cavity;
   c) at least one port, said at least one port being connected to an edge of said laser cavity from which said at least four conduits do not protrude;
   d) at least one input, said at least one input being connected to said at least one port;
   e) at least four mirrors, each of said at least four mirrors being disposed between one of said at least four outputs and one of said at least four conduits;
   f) a left preset contact connected to at least one of said at least four conduits, said left preset contact being connected to said at least one of said at least four conduits such that each of said at least four conduits protruding from said left edge of said cavity above a horizontal running through the center of said cavity;
   g) a right preset contact connected to at least one of said at least four conduits, said right preset contact being connected to said at least one of said at least four conduits such that each of said at least four conduits protruding from said right edge of said cavity above a horizontal running through the center of said cavity are contacted by said right preset contact;
   h) a bias contact connected to said cavity and at least two of said at least four outputs, wherein said bias contact is connected to said cavity and said at least four outputs such that said bias contact is in contact with substantially all of said cavity that does not contact said left preset contact and said right preset contact, and wherein a gap exists between said bias contact and each of said right preset contact and said left preset contact;
   i) a substrate connected to said laser cavity.

22. The photonic logic device of claim 21, further including at least one port connected to said at least one input and said cavity, wherein said port is disposed between said input and said cavity.

23. The photonic logic device of claim 22, wherein said at least one port is connected to said cavity at a conduit of said cavity.

24. The photonic logic device of claim 23, wherein said bias contact is composed of a material chosen from the group of materials consisting of titanium platinum gold, chromium gold, gold tin gold, germanium gold, nickel gold and any other suitable material.

25. The photonic logic device of claim 24, wherein said left preset contact is composed of a material chosen from the group of materials consisting of titanium platinum gold, chromium gold, gold tin gold, germanium gold, nickel gold and any other suitable material.

26. The photonic logic device of claim 25, wherein said right preset contact is composed of a material chosen from the group of materials consisting of titanium platinum gold, chromium gold, gold tin, germanium gold, nickel gold and any other suitable material.

27. The photonic logic device of claim 26, wherein each of the at least four outputs is chosen from the group of outputs consisting of a waveguide, an optical fiber, and any other suitable output.

28. The photonic logic device of claim 27, wherein the at least one input is chosen from the group of inputs consisting of a waveguide, an optical fiber and any other suitable input.

29. The photonic logic device of claim 28, wherein said laser cavity is substantially X-shaped.

30. The photonic logic device of claim 29, wherein each of said upper edge and said lower edge of said cavity are substantially parabolic.

31. The photonic logic device of claim 30, wherein each of the at least four outputs is chosen from the group of outputs consisting of a waveguide, an optical fiber, and any other suitable output.

32. The photonic logic device of claim 31, wherein the at least one input is chosen from the group of inputs consisting of a waveguide, an optical fiber and any other suitable input.

33. The photonic logic device of claim 21, wherein said at least one port is connected to said cavity at a conduit of said cavity.

34. The photonic logic device of claim 21, wherein said bias contact is composed of a material chosen from the group of materials consisting of titanium platinum gold, chromium gold, gold tin, germanium gold, nickel gold and any other suitable material.

35. The photonic logic device of claim 21, wherein said left preset contact is composed of a material chosen from the group of materials consisting of titanium platinum gold, chromium gold, gold tin, germanium gold, nickel gold and any other suitable material.

36. The photonic logic device of claim 21, wherein said right preset contact is composed of a material chosen from the group of materials consisting of titanium platinum gold, chromium gold, gold tin, germanium gold, nickel gold and any other suitable material.

37. The photonic logic device of claim 21, wherein each of the at least four outputs is chosen from the group of outputs consisting of a waveguide, an optical fiber, and any other suitable input.

38. The photonic logic device of claim 21, wherein the at least one input is chosen from the group of inputs consisting of a waveguide, an optical fiber and any other suitable input.

39. The photonic logic device of claim 21, wherein said laser cavity is substantially X-shaped.

40. The photonic logic device of claim 21, wherein each of said upper edge and said lower edge of said cavity are substantially parabolic.

41. The photonic logic device of claim 21, wherein each of the at least three outputs is chosen from the group of outputs consisting of a waveguide, an optical fiber, and any other suitable input.

42. The photonic logic device of claim 21, wherein the at least one input is chosen from the group of inputs consisting of a waveguide, an optical fiber and any other suitable input.

43. The device of claim 1, wherein at least two of said at least three conduits protrude from one edge of said laser cavity and at least one of said at least three conduits protrudes from the opposing edge of said laser cavity.

44. The device of claim 10, wherein at least two of said at least three conduits protrude from one edge of said laser cavity and at least one of said at least three conduits protrudes from the opposing edge of said laser cavity.

* * * * *